US012044718B2

(12) United States Patent
Naidu (10) Patent No.: US 12,044,718 B2
(45) Date of Patent: Jul. 23, 2024

(54) PARAMETER FREE TRAVELING WAVE BASED FAULT LOCATION FOR POWER TRANSMISSION LINES

(71) Applicant: Hitachi Energy Ltd, Zurich (CH)

(72) Inventor: Obbalareddi Demudu Naidu, Bangalore (IN)

(73) Assignee: Hitachi Energy LTD, Zürich (CH)

( * ) Notice: Subject to any disclaimer, the term of this patent is extended or adjusted under 35 U.S.C. 154(b) by 314 days.

(21) Appl. No.: 16/764,637

(22) PCT Filed: Jun. 15, 2018

(86) PCT No.: PCT/IB2018/054422
§ 371 (c)(1),
(2) Date: May 15, 2020

(87) PCT Pub. No.: WO2019/097312
PCT Pub. Date: May 23, 2019

(65) Prior Publication Data
US 2020/0400734 A1 Dec. 24, 2020

(30) Foreign Application Priority Data

Nov. 17, 2017 (IN) .............................. 201741041219

(51) Int. Cl.
*G01R 31/08* (2020.01)
(52) U.S. Cl.
CPC ......... *G01R 31/085* (2013.01); *G01R 31/088* (2013.01)
(58) Field of Classification Search
CPC .................................................. G01R 31/085
See application file for complete search history.

(56) References Cited

U.S. PATENT DOCUMENTS

| 4,766,549 A | 8/1988 | Schweitzer, III et al. |
| 8,655,609 B2 | 2/2014 | Schweitzer, III et al. |

(Continued)

FOREIGN PATENT DOCUMENTS

| CN | 102096022 A | 6/2011 |
| CN | 102253310 A | 11/2011 |

(Continued)

OTHER PUBLICATIONS

Gilany, Mahmoud, et al., "Traveling-Wave-Based Fault-Location Scheme for Multiend-Aged Underground Cable System", IEEE Transactions on Power Delivery, vol. 22, No. 1, Jan. 2007, pp. 82-89.

(Continued)

*Primary Examiner* — Hyun D Park
(74) *Attorney, Agent, or Firm* — Slater Matsil, LLP (57) ABSTRACT

A method can be used for fault location in a power transmission line connecting a first terminal with a second terminal. Arrival times of a first peak and a second peak of travelling waves are detected from measurements carried out at the first and second terminals. a rough location of a fault is identified based on a comparison of the arrival times obtained for the travelling waves detected from the measurements carried out at the first terminal, and the arrival times obtained for the travelling waves detected from the measurements carried out at the second terminal. The fault location is estimated based the rough location, the arrival times of the first and second peaks of the travelling waves detected from measurements carried out at the first and second terminals, and a length of the power transmission line.

9 Claims, 3 Drawing Sheets

(56) References Cited

U.S. PATENT DOCUMENTS

| | | | |
|---|---|---|---|
| 2011/0227581 A1 | 9/2011 | Kojovic et al. | |
| 2013/0096854 A1* | 4/2013 | Schweitzer, III | G01R 31/085 |
| | | | 702/59 |
| 2015/0081234 A1 | 3/2015 | Schweitzer, III et al. | |
| 2015/0081235 A1 | 3/2015 | Schweitzer, III et al. | |
| 2015/0233976 A1 | 8/2015 | Johannesson | |
| 2016/0308345 A1* | 10/2016 | Stoupis | H02H 1/0007 |
| 2017/0117701 A1 | 4/2017 | Johannesson | |
| 2019/0094288 A1* | 3/2019 | Schweitzer, III | G01R 31/085 |
| 2020/0350760 A1 | 11/2020 | Schweitzer, III et al. | |

FOREIGN PATENT DOCUMENTS

| | | |
|---|---|---|
| CN | 102495336 A | 6/2012 |
| CN | 102508109 A | 6/2012 |
| CN | 103116112 A | 5/2013 |
| CN | 103278747 A | 9/2013 |
| CN | 104535896 A | 4/2015 |
| CN | 105474022 A | 4/2016 |
| CN | 105492915 A | 4/2016 |
| CN | 105699855 A | 6/2016 |
| CN | 106093708 A | 11/2016 |
| CN | 106771881 A | 5/2017 |
| CN | 106796257 A | 5/2017 |
| FR | 2784192 A1 | 4/2000 |
| JP | H0815363 A | 1/1996 |
| JP | 2000055972 A | 2/2000 |
| JP | 2009041976 A | 2/2009 |
| WO | 2017125145 A1 | 7/2017 |

OTHER PUBLICATIONS

Jung, Chae-Kyun, et al., "Fault Location Algorithm on Underground Power Cable Systems Using Noise Cancellation Technique", 2008 IEEE/PES Transmission and Distribution Conference and Exposition, Chicago, IL, USA, Apr. 21-24, 2008, 7 pages.

Silva, M., et al., "A Fault Locator for Transmission Lines Using Traveling Waves and Wavelet Transform Theory", 2004 Eighth IEE International Conference on Developments in Power System Protection, Amsterdam, Netherlands, Apr. 5-8, 2004, pp. 212-215.

Lopes, F. V., et al., "Real-Time Traveling-Wave-Based Fault Location Using Two-Terminal Unsynchronized Data", IEEE Transactions on Power Delivery, vol. 30, No. 3, Jun. 2015, pp. 1067-1076.

Zimath, et al., "Traveling Wave-Based Fault Location Experiences", 2010 63rd Annual Conference for Protective Relay Engineers, College Station, TX, USA, Mar. 29-Apr. 1, 2010, 7 pages.

Qualitrol, "Qualitrol Traveling Wave Fault Locator Monitor", retrieved from http://www.qualitrolcorp.com/Products/TWS_FL-8_and_TWS_FL-1_Traveling_wave_fault_locators/ on Jun. 23, 2020, 4 pages.

Ge, Grid Solutions, Reason RPV311, retrieved from http://www.gegridsolutions.com/publications/GridSolutionsBrochures/Grid-SAS-L3-REASON_RPV311-0889-2015_10-EN.pdf on Jun. 23, 2020, 8 pages.

Lopes, Felipe V., "Settings-Free Traveling-Wave-Based Earth Fault Location Using Unsynchronized Two-Terminal Data", IEEE Transactions on Power Delivery, vol. 31, No. 5, Oct. 2016, 3 pages.

Yongtao, Guo et al., "Line Lightning Strike Location Based on Improved Double-Ended Traveling Wave Location Method", Sichuan Electric Power Technology, vol. 31, No. 3, Jun. 30, 2008, 5 pages.

Zewen, Li et al., "A New Algorithm for Double-End Traveling Wave Fault Location in Transmission Lines", Automation of Electric Power Systems, vol. 30, No. 15, Aug. 10, 2006, 4 pages.

Zhang, Feng et al., "A New Fault Location Method Avoiding Wave Speed and Based on Traveling Waves for EHV Transmission Line", Third International Conference on Electric Utility Deregulation and Restructuring and Power Technologies, Apr. 6-9, 2008, 5 pages.

* cited by examiner

PARAMETER FREE TRAVELING WAVE BASED FAULT LOCATION FOR POWER TRANSMISSION LINES

CROSS-REFERENCE TO RELATED APPLICATIONS

This patent application is a national stage filing of International Application No. PCT/IB2018/054422, filed on Jun. 15, 2018, which claims priority to Indian Patent Application No. 201741041219, filed on Nov. 17, 2017, which applications are hereby incorporated by reference in its entirety.

FIELD OF THE INVENTION

The present invention generally relates to fault location in power transmission lines. More specifically, the present invention relates to travelling wave based fault location with measurements at two ends of a power transmission line.

BACKGROUND OF THE INVENTION

Transmission lines are the backbone for transportation of electrical energy from sources of generation to load centers. Power transmission lines experience faults that are caused by nature such as by storms, lightning, snow, rain etc., and insulation breakdown and short circuit faults caused by birds, tree branches and other external objects.

Restoration of power supply after permanent faults can be done only after the maintenance team finishes the repair of the damage caused by the fault. For this purpose, the fault location has to be known, otherwise the whole line (or a major portion thereof) has to be inspected to find the fault point. This task becomes even more tedious and time consuming, if high voltage transmission lines, running upto hundreds of kilometers are considered.

Underground lines and cables have to be uncovered from under the ground, requiring more manpower and machines, and in populated areas, roads and passageways have to be blocked to perform the inspection and repair. Thus, it is important that the location of a fault is either known, or can be estimated with a good accuracy. This allows saving of both money and time for the inspection and repair work, and aids towards better service by utilities and improve the reliability. In other words, quick identification of fault location improves the reliability, and availability, and reduces revenue losses that may occur.

Fault location methods are classified into two categories based on the availability of input quantities, namely single ended and two ended. According to fault location principle fault location methods are categorized as impedance based methods, artificial intelligence based and traveling wave based methods Impedance-based fault locating methods require the fundamental voltages and currents to be accurately calculated. This requires reliable filtering techniques and long enough fault data set.

Integration of renewable energy systems to the grid can have an impact on the grid stability limits due to low inertia, and this will require faster fault clearing protection schemes. And also fast protection (example traveling wave) schemes will clear the fault in less than two cycles. If faults get cleared faster than two cycles, the current may not reach to its steady state, and the voltage may not drop from its faulted state to steady-state, so the impedance based fault locator tends to estimate location inaccurately.

In addition the impedance based fault location methods depend on mutual coupling, non-homogeneity of the line and source impedances, source to line impedance ratio, fault resistance and fault loop information etc. With recent improvements in data acquisition and signal processing technology, traveling-wave fault locators are becoming more popular where higher accuracy is important. Traveling wave based methods require only 2 to 3 millisecond (ms) data to locate the fault point and do not depend on the above mentioned factors. Fault location using a traveling wave can be estimated by multiplying the time difference between initial traveling waves and/or its reflection at the point and propagation velocity.

Communication based methods are considered more accurate and reliable. Two end synchronous measurement based traveling wave fault location method are known. The accuracy of traveling wave based methods depends on the accuracy of line parameters (such as inductance and capacitance per unit length). It is difficult to accurately estimate the line parameters as there are constant changes in the conditions of the power transmission line.

Setting free fault location methods may be used to avoid having to enter line parameter data. Such methods would require alternate signals for estimating required parameters. For example, the method may require both aerial and ground mode signals. The ground mode signals are highly attenuated and non-reliable and available only for earth faults. Thus, such methods may be suitable only for earth faults.

The accuracy of existing communication based methods depends highly on line propagation velocity. Propagation velocity can be calculated by using line parameters. Moreover, these line parameters are difficult to accurately capture, and the accuracy depends on many practical conditions such loading, weather, aging, material property etc. Therefore, there is a need for accurate fault location method which can overcome this challenge.

SUMMARY OF THE INVENTION

The present invention provides a method which is independent of line parameters. In other words, the present invention provides parameter free traveling wave based fault location for power transmission lines. The system and method of the present invention do not require experiments to calibrate the propagation velocity for deployment of a fault location solution.

There may be an electrical fault (or disturbance) at a particular location in the power transmission line. The fault may be located in a half (e.g. first half of the line, second half of the line), or at the mid-point of the line. Such a faulty half (or mid-point) can be identified as having the fault, from measurements carried out at the two terminals (i.e. measurements carried out at the first terminal and the second terminal, wherein the measurements are performed by synchronized devices). These measurements include current/voltage measurements carried out using measurement equipment. For example, the measurement equipment can include a current transformer, a potential transformer, a sensor-based measurement equipment (e.g. Rogowski coils, non-conventional instrument transformers etc.) and/or the like, which provides a signal corresponding to current, voltage or other information as sensed from the line.

Travelling waves are generated when there are faults in the line. The method comprises obtaining a plurality of parameters associated with travelling waves detected from measurements carried out at the first and second terminals. A travelling wave, and parameters thereof (e.g. arrival time, peak width, rise time etc.), can be detected from the measurements carried out at a terminal(s) (e.g. from the one or more signals received from the one or more measurement equipment). For example, a current signal may be digitized and processed to detect a travelling wave.

Different travelling waves are generated due to the fault, and can be detected from measurements at different terminals. The method comprises obtaining the plurality of parameters associated with the travelling wave detected from measurements at the first terminal, and obtaining the plurality of parameters associated with the travelling wave detected from measurements at the second terminal Here, the measurements at the first terminal and the second terminal are synchronized. For example, if two IEDs (or fault locators) obtain the measurements, then the two IEDs (and/or corresponding measurement equipment) are synchronized.

In an embodiment, the plurality of parameters comprises arrival time of a first peak and arrival time of a second peak of the travelling wave. Thus, for the travelling wave detected from the measurements carried out at the first terminal, the arrival time of the first peak, and the arrival time of the second peak are obtained. It should be noted that the second peak may correspond to a second travelling wave. This is when the second peak corresponds to a reflected wave from a point different from the fault (e.g. far end). Similarly, for the travelling wave detected from the measurements carried out at the second terminal, the arrival time of the first peak, and the arrival time of the second peak are obtained.

The method further comprises identifying the faulty half, or the mid-point as having the fault. The faulty half (or mid-point) of the line is identified with the fault based on a comparison of the arrival times of the travelling wave detected at the first terminal with the arrival times of the travelling wave detected at the second terminal. In an embodiment, the faulty half (or mid-point) is identified by comparing (tn2−tm1) with (tm2−tn1), wherein tm1 and tm2 are the arrival times of the first and second peaks detected from the measurements carried out at the first terminal, and tn1 and tn2 are the arrival times of the first and second peaks detected from the measurements carried out at the second terminal.

The difference between (tn2−tm1) and (tm2−tn1) can be compared with a threshold value to determine the faulty half (or mid-point). The threshold value may be determined according to the sampling frequency. For example, for a 1 MHz sampling the threshold can be 1 or 2 microseconds. The threshold value can be determined beforehand (e.g. set by a personnel). Once it is determined that the fault is not at the mid-point, another comparison can be performed to identify the faulty half. Here, one of the first half and the second half is identified as the faulty half. Such identification may be done by checking which of the two quantities (i.e. (tn2−tm1) or (tm2−tn1)) is of a higher value. For example, the fault can be identified in the first half if (tn2−tm1) is greater than (tm2−tn1), and the fault can be identified in the second half if (tm2−tn1) is greater than (tn2−tm1).

This faulty half (or mid-point) identification is used for estimating the fault location. Depending on whether the fault is identified in the first half, the second half, or the mid-point, the fault location can be estimated using the arrival times of the first and second peaks at the first and second terminals, and length of the power transmission line.

If the fault is identified in the first half, the fault location (d1) can be estimated by:

$$d1 = ((tm2 - tm1) + (tn2 - tn1)) \times \frac{L}{4(tn2 - tm1)}.$$

If the fault in identified in the second half, the fault location (d2) can be estimated by:

$$d2 = L - ((tm2 - tm1) + (tn2 - tn1)) \times \frac{L}{4(tm2 - tn1)}.$$

In the above, tm1, tm2, tn1, and tn2 are the arrival times of the first and second peaks detected from measurements carried out at the first and the second terminals respectively, and L is the length of the power transmission line (line length).

In case the fault location is identified as the mid-point, the fault location can be estimated by taking an average of two fault locations, wherein a first fault location is estimated for fault in the first half of the line (e.g. d1), and a second fault location is estimated for a fault in the second half of the line (e.g. d2).

The method described hereinabove, may be implemented with one or more devices associated with the power transmission line. The devices may include a power system device such as a relay, an Intelligent Electronic Device (IED) or fault locator, and/or a server connected with the power system devices.

In the case wherein the method is implemented with an IED or relay, the device may be associated with bus M or bus N, or other point in the line. Here, the device estimates the required parameters/receives the parameters for fault location from other power system devices. For example, IED at bus M can obtain travelling wave related parameters from measurements at bus M, and receive the travelling wave related measurements at bus N from another IED or power system device. In this example, the IED can receive a signal(s) from the measurement equipment, and obtain measurements therefrom, or the measurement equipment publishes the measurements over a bus (e.g. process bus), and the IED (e.g. subscribed to receive data from such bus) receives the measurements over the bus. The travelling wave detection may alternately be performed at another power system device, and the obtained measurements (or parameters) may be communicated to the IEDs or server implementing the method.

Thus, the steps of the method may be performed by one or more modules. The modules may be implemented with one or more processors. For instance, in the example where the IED performs the method, the modules are implemented with the processor of the IED. In the other example where a server performs the method, the modules are implemented with the processor of the server. In case the method is implemented in part by IED, and in part by the server, the modules (depending on the step) will be distributed accordingly in the IED and the server.

In one embodiment, the modules comprise a travelling wave detector, a faulty half identifier and a fault locator. The travelling wave detector is for obtaining the plurality of parameters associated with the travelling waves detected from the measurements carried out at the first and second terminals, such as the arrival times of the first and second peaks. The faulty half identifier is for identifying one of the first half, the second half, and the mid-point of the power transmission line, as having the fault. The fault locator is for estimating the fault location based on the identification of the first half, the second half and the mid-point, as having the fault.

BRIEF DESCRIPTION OF DRAWINGS

The subject matter of the invention will be explained in more detail in the following text with reference to exemplary embodiments which are illustrated in attached drawings in which.

DETAILED DESCRIPTION

The present invention proposes a method which is independent of line parameters. In other words, the present invention provides parameter free traveling wave based fault location for power transmission lines. The system and method of the present invention do not require experiments to calibrate the propagation velocity for deployment of a fault location solution.

Figure 1A:
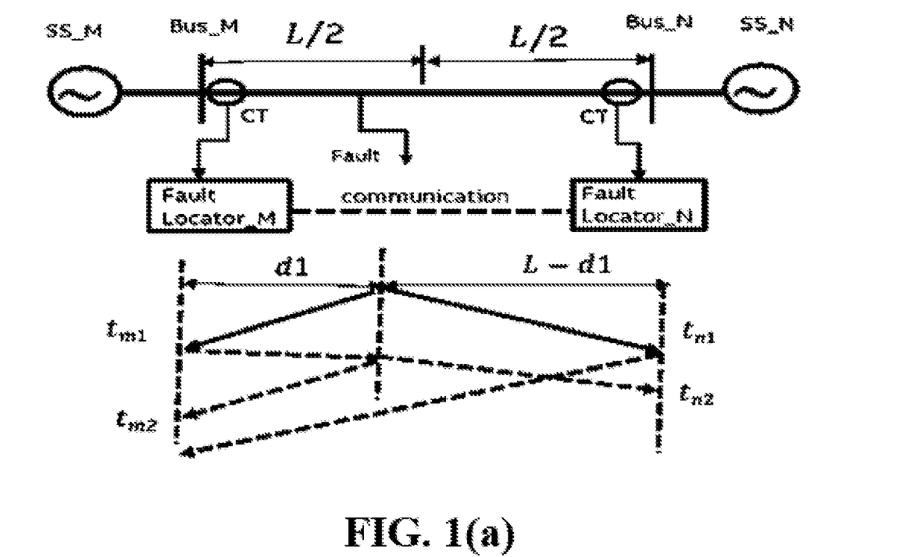
FIGS. 1(a) and 1(b) show Bewley lattice diagrams for faults in first and second halves of a power transmission line.

FIG. 1(a) shows a Bewley lattice diagram for a case when the fault has occurred in the first half of the line. In this case, at bus M side, for travelling wave generated from the fault point, the first peak as well as the second peak arrived from the fault point (i.e. not as a reflection from N-side). At bus N side, for travelling wave generated from the fault point, the first peak arrived from fault point, and the second peak arrived from far end bus (i.e. from M side) as a result of a reflected wave as shown.

The fault location can be calculated as follows. From FIG. 1(a) Bewley lattice diagram, we can write:

$$tm1 = t0 + \frac{d1}{V}; \quad tm2 = t0 + \frac{3d1}{V} \quad (1)$$

$$tn1 = t0 + \frac{L-d1}{V}; \quad tn2 = t0 + \frac{d1+L}{V} \quad (2)$$

where, t0=fault inception or detected time, tm1 and tm2=first and second peak arrival times at bus M; tn1 and tn2=first and second peak arrival times at bus N; and d1=fault location in case of a fault is in a first half of the line.

Solving the equations (1) and (2), fault location is given by equation (3)

$$d1 = ((tm2 - tm1) + (tn2 - tn1)) \times \frac{L}{4(tm2 - tm1)} \quad (3)$$

Figure 1B:
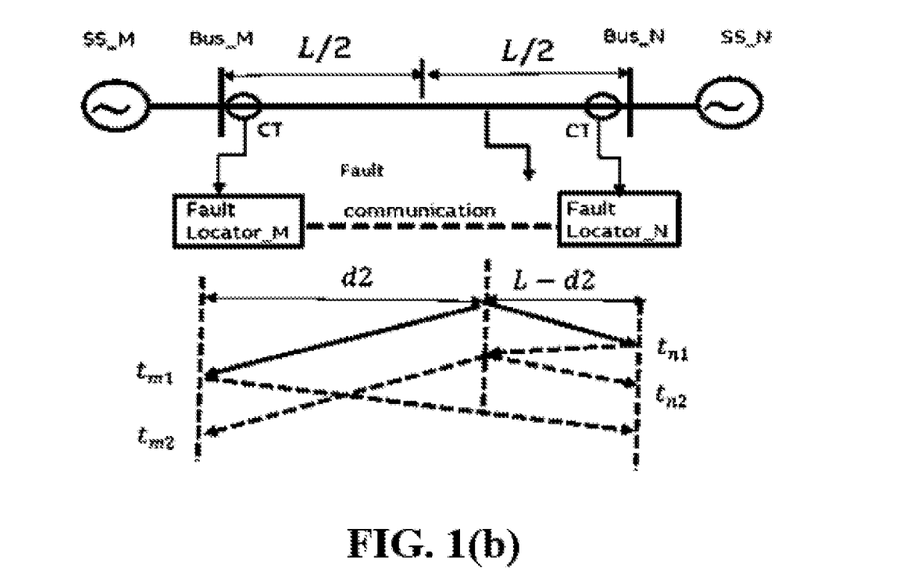

FIG. 1(b) shows a Bewley lattice diagram for a case, when the fault has occurred in the second half of the line. In this case, at bus M side, the first peak arrived from the fault point and the second peak arrived from the far end bus (i.e. from N side), and at bus N side, the first peak as well as the second peak arrived from the fault point. Here, the fault location can be calculated as follows. From FIG. 1(b) Bewley lattice diagram, we can write, $$tm1 = t0 + \frac{d2}{V}; \quad tm2 = t0 + \frac{2L-d2}{V} \quad (4)$$

$$tn1 = t0 + \frac{L-d2}{V}; \quad tn2 = t0 + \frac{3(L-d2)}{V} \quad (5)$$

where, tm1 and tm2=first and second peak arrival times at bus M; tn1 and tn2=first and second peak arrival times at bus N; and d2=fault location if fault is in the second half.

Solving the equations (4) and (5), fault location is given by equation (6)

$$d2 = L - ((tm2 - tm1) + (tn2 - tn1)) \times \frac{L}{4(tm2 - tm1)} \quad (6)$$

Hence, we need to select the actual fault location from the two fault location estimates calculated using equation (3) and (6). For this, we need to know if the fault has occurred in the first half or the second half of the line.

Faulty Half (or Section) Identification:

The faulty half (i.e. first half from bus M to mid-point, or second half from bus N to mid-point) can be determined from comparison of the arrival times of the peaks detected at bus M and bus N.

From equation (1) and (2), we have $$(tn2-tm1)=L \quad (7)$$

$$(tm2-tn1)=4d1-L \quad (8)$$

Comparing equation (7) and (8) gives the below relationship (9)

$$(tn2-tm1)>(tm2-tn1) \rightarrow L>4d1-L \quad (9)$$

Here, the fault can be identified in the first half (or section), if the difference of the second arrival time measured at bus N and the first arrival time measured at bus M, is always greater than difference of the second arrival time measured at bus M and the first arrival time measured at bus N for a condition (0<L/4<L/2).

We can identify the faulty half by using following relationships:

$$(tn2-tm1)-(tm2-tn1) \leq e \rightarrow \text{Fault is in middle of the line} \quad (10)$$

$$(tn2-tm1)>(tm2-tn1) \rightarrow \text{Fault is in first half of the line} \quad (11)$$

$$(tn2-tm1)<(tm2-tn1) \rightarrow \text{Fault is in second half of the line} \quad (12)$$

In the above, e is small threshold and approximately zero. The threshold value may be determined according to the sampling frequency. For example, for a 1 MHz sampling the threshold can be 1 or 2 micro seconds. The threshold value can be determined beforehand (e.g. set by a personnel).

Figure 2:
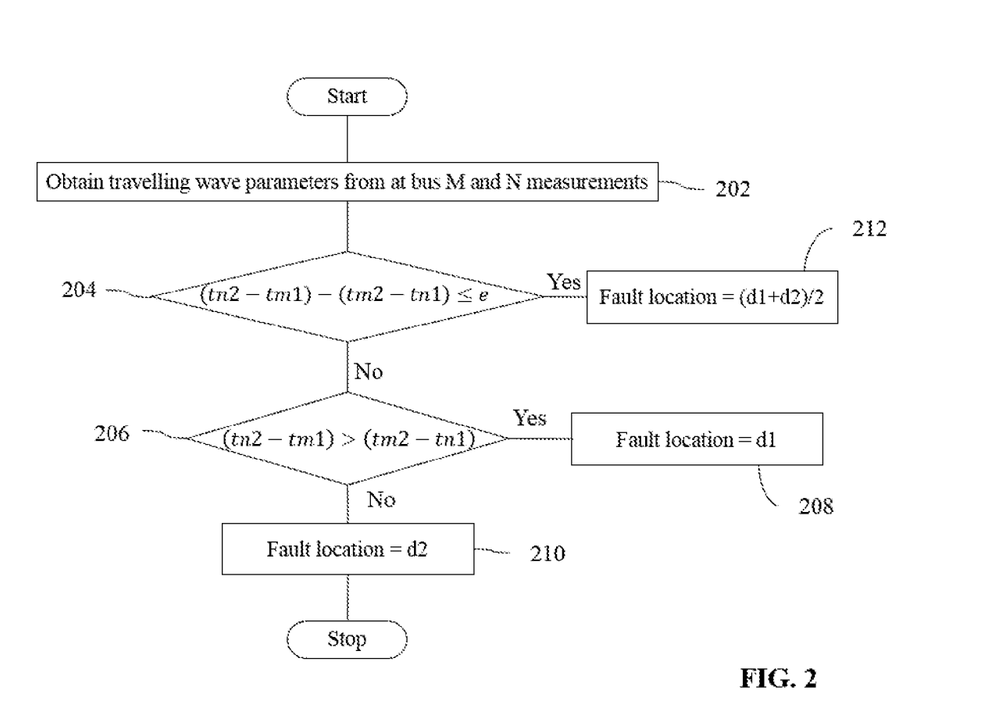
FIG. 2 is a flowchart of a method for fault location in the power transmission line, in accordance with an embodiment of the invention.

Referring now to FIG. 2, which is a flowchart of the method for fault location in the power transmission line, in accordance with an embodiment of the invention.

At 202, travelling wave parameters are obtained. In case the fault locators shown in FIGS. 1(a) and 1(b), are used for implementing the method, travelling waves can be detected by the fault locators at bus M (first terminal) and bus N (second terminal) respectively. Alternately, a travelling wave detector may be used for detecting the travelling wave and obtaining the parameters (e.g. arrival time, peak width, rise time etc.) thereof. The travelling wave detector may be a standalone device (connected with the measurement equipment such as CT at bus M) or a module implemented with a processor of a power system device (such as 302).

In accordance with some embodiments (e.g. illustrated with FIGS. 1(*a*) and 1(*b*)), the first and second peak arrival times at bus M (tm1 and tm2) and bus N (tn1 and tn2) are obtained.

The method also comprises identifying the faulty half, or the mid-point as having the fault. The faulty half (or mid-point) of the line is identified with the fault based on a comparison of the arrival times for the first and second peaks at bus M and N respectively. In the embodiment of FIG. 2, at 204, the difference between (tn2−tm1) and (tm2−tn1) is compared with the threshold value (e.g. e) to identify the faulty half.

According to the comparison at 204, another comparison of the arrival times can be performed at 206, to identify the faulty half. For example, it can be determined if (tn2−tm1) is greater than (tm2−tn1). Accordingly, the fault can be determined to be located in the first half, or the second half of the line (refer description above). First half in accordance with the examples shown would refer to the part of the line from bus M to the mid-point, which has length L/2, and similarly second half would refer to the part from bus N to the mid-point, which also has length L/2.

If the fault is identified in the first half based on comparison at 206, the fault location (d1) can be estimated at 208 using C(3), i.e.:

$$d1 = ((tm2 - tm1) + (tn2 - tn1)) \times \frac{L}{4(tn2 - tm1)}.$$

If the fault in identified in the second half based on comparison at 206, the fault location (d2) can be estimated at 210 using C(6), i.e.:

$$d2 = L - ((tm2 - tm1) + (tn2 - tn1)) \times \frac{L}{4(tm2 - tn1)}.$$

In case the fault location is identified to be at the mid-point (i.e. around mid-point region) at 204, then in accordance with the embodiment, the fault location is estimated by (d1+d2)/2 as shown at 212.

As described above, the method may be implemented by one or more devices associated with the power transmission line such as IEDs (or fault locators), relays or other such power system devices. In accordance with the embodiments shown in FIGS. 1(*a*) and 1(*b*), the method is implemented with the fault locator at bus M, or with the fault locator at bus N. Alternately, both the fault locators may implement the method. Here, the fault locator at bus M gets the travelling wave measurements at bus M, and similarly the fault locator at bus N gets the travelling wave measurements at bus N. In this example, the IED can receive a signal(s) from the measurement equipment (here CT as shown in FIG. 1(*a*), or 1(*b*)), and obtain measurements therefrom, or the measurement equipment publishes the measurements over a bus (e.g. process bus), and the IED (e.g. subscribed to receive data from such bus) receives the measurements over the bus. The fault locators communicate with each other through standard communication. Thus, the fault locator at bus M sends the travelling wave related information to the fault locator at bus N (and vice versa).

Figure 3:
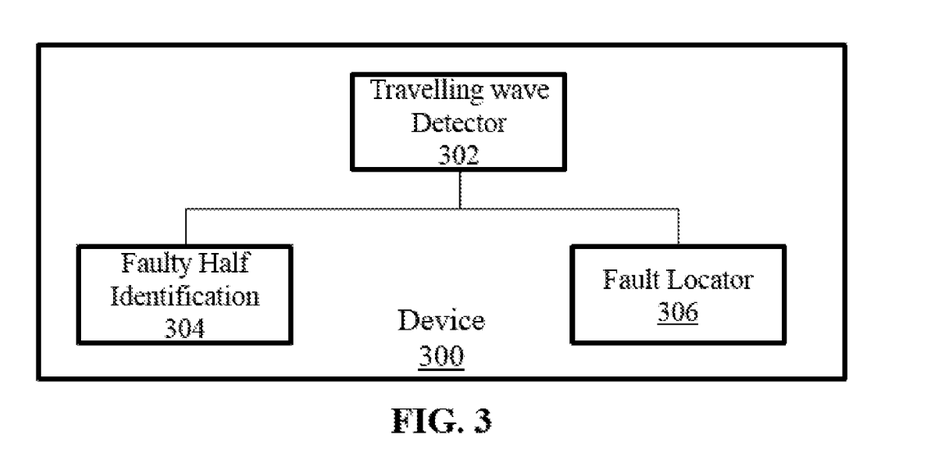
FIG. 3 is a simplified block diagram of a device for fault location, in accordance with an embodiment of the invention.

The steps of the method may be performed by one or more modules. The modules may be implemented with one or more processors. For instance, in the example where the fault locator performs the method, the modules are implemented with the processor of the fault locator (at bus M, or bus N or in each fault locator). Such an embodiment is illustrated in FIG. 3. Here, the device (300) comprises a travelling wave detector (302), faulty half identifier (304) and a fault locator (306). The travelling wave detector obtains the travelling wave parameters as described hereinabove. This module may additionally detect the travelling waves from the measurements, and obtain the parameters accordingly. The faulty half identifier identifies the faulty half or mid-point (region) as having the fault, and the fault locator locates the fault based on the faulty half identification and travelling wave parameters.

Figure 4:
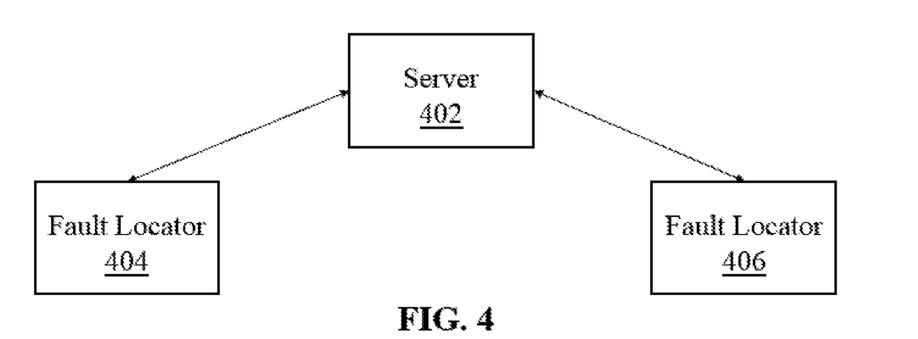
FIG. 4 is a simplified representation of a system for fault location, in accordance with an embodiment of the invention.

An example where a server (402) performs the method is shown in FIG. 10. In this embodiment, the modules are implemented with the processor of the server. In case the method is implemented in part by IED, and in part by the server, the modules (depending on the step) will be distributed accordingly in the IED and the server. For example, the travelling wave detector may be provided on different fault locators (such as 404, 406), which obtain and communicate the travelling wave parameters to the server, which has the faulty half identifier and the fault locator. The fault location can be communicated to the fault locators for display.

Thus, the present invention provides two-ended travelling wave based fault location using only arrival times, and line length. This eliminates the need of using line parameters (propagation velocity or wave speed), thereby improving accuracy of fault location.

I claim:

1. A method for fault location in a power transmission line connecting a first terminal with a second terminal, wherein the method is implemented with a processor of a device associated with the power transmission line, the method comprising:

obtaining arrival times of a first peak and a second peak of travelling waves detected from measurements carried out at the first and second terminals;

identifying one of a first half, a second half, and a mid-point of the power transmission line as having the fault, based on a comparison of (tn2−tm1) with (tm2−n1), wherein tm1 and tm2 are the arrival times of the first and second peaks obtained for the travelling wave detected from the measurements carried out at the first terminal, and tn1 and tn2 are the arrival times of the first and second peaks obtained for the travelling wave detected from the measurements carried out at the second terminal;

estimating the fault location based on the identification of the first half, the second half, and the mid-point, as having the fault, the arrival times of the first and second peaks of the travelling waves detected from measurements carried out at the first and second terminals, and a length of the power transmission line, wherein estimating the fault location is not based on capacitance, inductance, or propagation velocity of the power transmission line; and repairing the power transmission line based on the estimated fault location, wherein:

the fault is identified as being in the first half when (tn2−tm1) is greater than (tm2−tn1) and the fault is identified as being in the second half when (tm2−tn1) is greater than (tn2−tm1), and the fault location in the first half of the line $$\left(((tm2-tm1)+(tn2-tn1))\times \frac{L}{4(tn2-tm1)}\right);$$

or the fault location in the second half of the line is estimated from $$\left(L-((tm2-tm1)+(tn2-tn1))\times \frac{L}{4(tn2-tm1)}\right),$$

wherein L is the length of the power transmission line, or
the fault is identified as being in the first half when (tn2 - tm1) is greater than (tm2−tn1) and the fault is identified as being in the second half when (tm2−tn1) is greater than (tn2−tm1), and the mid-point of the power transmission line is identified as having the fault when a difference between (tn2−tm1) and (tm2−tn1) is less than a threshold value, or the fault location in the first half of the line is estimated from $$\left(((tm2-tm1)+(tn2-tn1))\times \frac{L}{4(tn2-tm1)}\right),$$

wherein L is the length of the power transmission line, or the fault location in the second half of the line is estimated from $$\left(L-((tm2-tm1)+(tn2-tn1))\times \frac{L}{4(tn2-tm1)}\right),$$

wherein L is the length of the power transmission line, or
the mid-point of the power transmission line is identified as having the fault when the difference between (tn2−tm1) and (tm2−tn1) is less than a threshold value.

2. The method of claim 1, wherein the fault location is estimated by taking an average of first and second fault locations, wherein the first fault location is estimated for a fault in the first half of the line and the second fault location is estimated for a fault in the second half of the line.

3. A method for fault location in a power transmission line connecting a first terminal with a second terminal, the method comprising:
measuring voltages or currents at the first terminal;
measuring voltages or currents at the second terminal;
calculating arrival times of a first peak and a second peak of travelling waves at the first terminal based on the measurements of the voltages or currents carried at the first terminal;
calculating arrival times of the first peak and the second peak of the travelling waves at the second terminal based on the measurements of the voltages or currents carried at the second terminal;
identifying a rough location of a fault based on a comparison of (tn2−tm1) with (tm2−tn1), wherein tm1 and tm2 are the arrival times of the first and second peaks obtained for the travelling wave detected from the measurements carried out at the first terminal, and tn1 and tn2 are the arrival times of the first and second peaks obtained for the travelling wave detected from the measurements carried out at the second terminal, the rough location being one of a first half of the power transmission line, a second half of the power transmission line, or a mid-point of the power transmission line;
estimating the fault location based on the rough location, the arrival times calculated based on the measurements at the first terminal, the arrival times calculated based on the measurements at the second terminal, and a length of the power transmission line, wherein estimating the fault location is not based on capacitance, inductance, or propagation velocity of the power transmission line; and
repairing the power transmission line based on the estimated fault location, wherein:
the fault is identified as being in the first half when (tn2−tm1) is greater than (tm2−tn1) and the fault is identified as being in the second half when (tm2−tn1) is greater than (tn2−tm1), and the fault location in the first half of the line is estimated from $$\left(((tm2-tm1)+(tn2-tn1))\times \frac{L}{4(tn2-tm1)}\right),$$

or the fault location in the second half of the line is estimated from $$\left(L-((tm2-tm1)+(tn2-tn1))\times \frac{L}{4(tn2-tm1)}\right),$$

wherein L is the length of the power transmission line, or
in the first half when (tn2−tm1) is greater than (tm2−tn1) and the fault is identified as being in the second half (tm2−tn1) is greater than (tn2−tm1), and the mid-point of the power transmission line is identified as having the fault when the difference between (tn2−tm1) and (tm2−tn1) is less than a threshold value, or
the fault location in the first half of the line is estimated from $$\left(((tm2-tm1)+(tn2-tn1))\times \frac{L}{4(tn2-tm1)}\right),$$

wherein L is the length of the power transmission line, or the fault location in the second half of the line is estimated from $$\left(L-((tm2-tm1)+(tn2-tn1))\times \frac{L}{(tm2-tn1)}\right),$$

wherein L is the length of the power transmission line, or
the mid-point of the power transmission line is identified as having the fault when a difference between (tn2−tm1) and (tm2−tn1) is less than a threshold value.

4. The method of claim 3, wherein the fault location is estimated by taking an average of first and second fault locations, wherein the first fault location is estimated for a fault in the first half of the line and the second fault location is estimated for a fault in the second half of the line.

5. A device for fault location in a power transmission line connecting first and second terminals, the device including a processor and a receiver, the receiver configured to:
receive measurements carried out at the first terminal of the power transmission line; and
receive measurements carried out at the second terminal of the power transmission line;
the processor configured to:
obtain arrival times of a first peak and a second peak of travelling waves detected from the received measurements carried out at the first and second terminals;
identify one of a first half, a second half, and a mid-point of the power transmission line as having the fault, based on a comparison of (tn2−tm1) with (tm2−tn1), wherein tm1 and tm2 are the arrival times of the first and second peaks obtained for the travelling wave detected from the received measurements carried out at the first terminal, and tn1 and tn2 are the arrival times of the first and second peaks obtained for the travelling wave detected from the received measurements carried out at the second terminal; and
estimate the fault location based on the identification of the first half, the second half or the mid-point as having the fault, the arrival times of the first and second peaks of the travelling waves detected from the measurements carried out at the first and second terminals, and a length of the power transmission line, wherein estimating the fault location is not based on capacitance, inductance, or propagation velocity of the power transmission line; and
repair the power transmission line based on the estimated fault location, wherein:
the fault is identified as being in the first half when (tn2−tm1) is greater than (tm2−tn1) and the fault is identified as being in the second half when (tm2−tn1) is greater than (tn2−tm1), and the fault location in the first half of the line is estimated from $$\left(((tm2-tm1)+(tn2-tn1))\times \frac{L}{4(tn2-tm1)}\right),$$

or
the fault location in the second half of the line is estimated from $$\left(L-((tm2-tm1)+(tn2-tn1))\times \frac{L}{(tm2-tn1)}\right),$$

wherein L is the length of the power transmission line, or
the fault is identified as being in the first half when (tn2−tm1) is greater than (tm2−tn1) and the fault is identified as being in the second half when (tm2−tn1) is greater than (tn2−tm1), and the mid-point of the power transmission line is identified as having the fault when a difference between (tn2−tm1) and (tm2−tn1) is less than a threshold value, or
the fault location in the first half of the line is estimated from $$\left(((tm2-tm1)+(tn2-tn1))\times \frac{L}{4(tn2-tm1)}\right),$$

wherein L is the length of the power transmission line, or
the fault location in the second half of the line is estimated from $$\left(L-((tm2-tm1)+(tn2-tn1))\times \frac{L}{(tm2-tn1)}\right),$$

wherein L is the length of the power transmission line, or
the mid-point of the power transmission line is identified as having the fault when the difference between (tn2−tm1) and (tm2−tn1) is less than a threshold value.

6. The device of claim 5, wherein the device is an intelligent electronic device associated with the first terminal.

7. The device of claim 6, wherein the device is configured to receive the measurements carried out at the corresponding terminal from measurement equipment associated with the first terminal, and to receive the measurements carried out at the second terminal over a communication channel from a device associated with the second terminal of the power transmission line.

8. The device of claim 5, wherein the device is a server connected with intelligent electronic devices associated with the first and second terminals, respectively.

9. The device of claim 8, wherein the server is configured to receive travelling wave parameters obtained by the intelligent electronic devices from the measurements carried out at the respective terminals.

* * * * *